United States Patent

Cunningham et al.

[15] 3,654,526

[45] Apr. 4, 1972

[54] METALLIZATION SYSTEM FOR SEMICONDUCTORS

[72] Inventors: James A. Cunningham, Houston; Clyde R. Fuller, Plano; Robert C. Hooper; Robert H. Wakefield, both of Houston, all of Tex.

[73] Assignee: Texas Instruments Incorporated, Dallas, Tex.

[22] Filed: May 19, 1970

[21] Appl. No.: 38,817

[52] U.S. Cl. ....................317/234 R, 317/235 D, 317/234 L, 317/234 M

[51] Int. Cl. ..........................................................H01l 5/02

[58] Field of Search .......................317/234 L, 234 M, 235 D

[56] References Cited

UNITED STATES PATENTS

| | | | |
|---|---|---|---|
| 3,436,616 | 4/1969 | Jarrod | 317/234 |
| 3,429,029 | 2/1969 | Langdon | 29/589 |
| 3,409,809 | 11/1968 | Diehl | 317/234 |
| 3,495,324 | 2/1970 | Guthrie | 29/578 |
| 3,434,020 | 3/1969 | Ruggiero | 317/235 |
| 3,426,252 | 2/1969 | Lepselter | 317/234 |
| 3,556,951 | 1/1971 | Cereniglin | 204/15 |
| 3,444,440 | 5/1969 | Bell | 317/234 |
| 3,562,040 | 2/1971 | Garies | 156/18 |
| 3,489,953 | 1/1970 | Thomas | 317/101 |

*Primary Examiner*—John W. Huckert
*Assistant Examiner*—Martin H. Edlow
*Attorney*—James O. Dixon, Andrew M. Hassell, Richards, Harris & Hubbard, Harold Levine, Melvin Sharp, John E. Vandigriff, Henry T. Olsen and Michael A. Sileo, Jr.

[57] ABSTRACT

A metallization system for semiconductor devices includes a first layer of aluminum a part of which is in ohmic contact with a silicon substrate and devices thereon, the other part of which overlies an insulating layer. A second layer of molybdenum is deposited on the aluminum layer. The aluminum and molybdenum are photoetched into a predetermined pattern which ohmically contacts the silicon and overlies an insulating layer, usually of silicon dioxide. Thereafter a variety of techniques and lead systems can be used. For example, a second layer of insulating material can be applied over the first level aluminum-molybdenum metallization system and the first layer of insulating material. The second level of insulating material can then be selectively etched to expose predetermined portions of the first level lead system. Thereafter, beam leads can be attached to the first level metallization system; or bonding pads can be formed in ohmic contact with the first level metallization system. Alternatively, a second level metallization system can be utilized where it becomes necessary to conductively connect various components on the semiconductor device by lead cross-overs. A third layer of insulating material can then be applied on top of the second level metallization system. After selective etching of the second level insulating material, beam leads, bonding pads or even a third level metallization system can be applied.

5 Claims, 10 Drawing Figures

INVENTORS:
JAMES A. CUNNINGHAM
CLYDE R. FULLER
ROBERT C. HOOPER
ROBERT H. WAKEFIELD

INVENTORS:
JAMES A. CUNNINGHAM
CLYDE R. FULLER
ROBERT C. HOOPER
ROBERT H. WAKEFIELD

METALLIZATION SYSTEM FOR SEMICONDUCTORS

This invention relates to semiconductor devices, particularly, one aspect of the present invention relates to semiconductor devices of the integrated circuit type requiring one or more levels of metallization combined with external lead systems.

The semiconductor industry is presently searching, and has been for some time, for better and less expensive ways to encapsulate semiconductor devices. Until recently, the most commonly and widely used technique for encapsulating devices has been to mount the device on a metal and glass header and completing the encapsulating with a metal can. The header and can arrangement is very expensive. The cost of the header and can sometimes exceeds the cost of the semiconductor device itself.

Synthetic polymeric capsules, usually of a thermosetting resin, have been suggested for semiconductors, including transistors, diodes, integrated circuits and the like. The semiconductor industry has steadily increased the volume and variety of devices packaged or encapsulated in plastic. Presently a very large percentage of the total production of silicon integrated circuits is enclosed in plastic, which is substantially less expensive than the above-mentioned header and can arrangement. For example, epoxy and silicone polymers are used to encapsulate devices by transfer molding. Casting also is a common technique. Intermediate in expense between the header and can arrangement and plastic encapsulation is the affixation of a metal cap to a ceramic base utilizing a strong organic adhesive such as an epoxy resin.

It is generally agreed that the seal provided by methods other than the header and can arrangement does not provide a hermetic seal typical in the metal and glass encapsulated transistors. In the latter, leak rates on the order of $10^{-10}$ cc./sec. of helium or less are common. Plastic not only has a relatively high permeation rate to various gases, but the transfer of ambient gases including water vapor along the metal lead-plastic interface toward the active device has been a particular problem for the industry.

Ambient gas penetration of semiconductor packages is probably not a serious problem with respect to possible surface degradation of the device itself. Problems associated with corrosion of the thin metal layers used to make contacts, leads and to interconnect the different regions of semiconductor devices is of considerably more concern to the industry today. This corrosion is caused by penetration of the package by ambient water vapors. Corrosion of these thin metal layers is minimized in single devices due to the minimum amount of metal films necessary to complete interconnection. The problem is more highly apparent in multi-component devices such as integrated circuits. However, even in single device packages, corrosion can occur at lead/bonding pad locations if dissimilar metals are used.

Integrated circuit devices may and usually do have a number of active and passive components, such as transistors, capacitors, and resistors which are formed by diffusion beneath a surface or major face of a semiconductor wafer. An insulating layer overlies the face of the wafer and has openings to the semiconductor surface. Metallic layers are deposited over the insulating layer. These metallic layers interconnect in a predetermined pattern various regions of the semiconductor device through openings in the insulating layer. The length of these thin metal layers is usually very high in integrated circuits compared to a single device because of the necessary interconnection between the different regions. Of course, the more surface area of interconnecting metal layers exposed to ambient gases, the greater the opportunity for corrosion. As the complexity of interconnection patterns increases, it becomes necessary to form more than one level of metallized interconnections. The levels, of course, are electrically isolated by various layers of insulating material at the cross-over points. Although the lower layers are isolated from ambient, the topmost or last layer of interconnections still is usually exposed to ambient gases, thus causing the distinct possibility of corrosion of the topmost thin metal layers or metallization systems.

Aluminum and a two layered gold-molybdenum system are two metals or metallization systems which are commonly used to form semiconductor leads and contacts on integrated circuits. Aluminum has been used quite extensively in integrated circuits. In single component devices, also, bonding pads are usually made from aluminum. Gold wires are commonly used to connect the aluminum pad to a lead which allows electrical contact to the world outside the encapsulated device. However, when aluminum is used in a nonhermetic environment, ionic conduction currents can be established between dissimilar metals, for example, aluminum and gold. Upon surface absorption of sufficient water vapor on the device to form an electrolyte of sufficient thickness and conductivity, the aluminum-gold couple is particularly active, self-biasing to about 3 volts.

In the initial stages of the reaction, aluminum, being anodic, oxidizes to $Al_{3+}$ while at the cathode, hydrogen evolution takes place. The aluminum ion thus liberated reacts immediately with water according to the reaction $$2Al^{3+} + 3H_2O = Al_2O_3 + 6H^+,$$

forming insoluble and insulating $Al_2O_3$. The formation of this insulating skin, of course, slows the reaction and tends to protect the anode from further dissolution. Unfortunately, however, the anodic oxide is of sufficient permeability and imperfection that oxidation continues. Usually, the attack takes place in localized spots near the cathode resulting in pitting. The aluminum is carried away as $AlO_2^-$ ions.

Aluminum corrosion also takes place in a different way. Since the solution near the cathode becomes basic, unbiased regions nearby will dissolve according to the reaction $$2Al + 2OH^- + 2H_2O = 2AlO_2^- + 3H_2.$$

In this case, no protective skin forms. This reaction continues until an open circuit is produced. The dissolved aluminum does not redeposit as the metal at a cathodic site since hydrogen evolution is more favorable. Applying an external bias to the system causes hydrogen evolution to speed up in the cathodically biased areas, while the negatively biased metal regions do not corrode. The anodic reactions are likewise accelerated with oxygen evolution becoming a competitive electrolytic process. Some of the oxygen migrates to the cathode where it is reduced back to water. Using an aluminum lead wire instead of gold offers protection from the self-biasing or galvanic cell nature of the system, but an aluminum lead can corrode upon application of an external bias.

The molybdenum-gold system behaves somewhat differently. Since the oxides of molybdenum are water soluble (for example, $Mo_2O_5$), the metal does not passivate as readily as aluminum. Consequently, the system will self-bias and corrode readily with molybdenum dissolving at the anode until an open circuit is generated. The application of bias speeds both electrode processes. Unless very high electrode biases are applied (above 5 volts), oxygen evolution will not become significantly competitive since molybdenum dissolution is more electrochemically favorable. Also at high external biases, gold dissolution at anodic sites becomes competitive. But since the oxidation potential of gold is quite negative, oxygen evolution is predominant. Nevertheless, some gold can dissolve at the anode according to the following reaction:

$$Au + xH_2O = Au(aq) + e^-$$

Gold, of course, forms no stable oxides. The gold that does not dissolve anodically is removed uniformly over the entire anodic area with no pitting resulting therefrom. The gold ion is transported in the electrolyte to the nearest cathodic region where it plates back out as the metal.

It has been suggested that these above problems can be overcome by utilizing metallic layers of tungsten and a modifier metal which has greater corrosion resistance than tungsten. These metallization systems, however, also have certain drawbacks for most devices. Since tungsten and a modifier metal such as titanium would fractionate if conventional evaporation methods were used; such films can only be deposited by sputtering techniques, such as RF-sputtering. However, the energies of the sputtered metal atoms arriving at the substrate is quite high (10–100 electron volts) and the silicon wafers are immersed in energetic argon. In addition, the silicon wafers or substrates are immersed in an energetic plasa during the metal film deposition. This highly energetic bombardment can cause a modification in the semiconductor substrates which causes the Qss charge to rise. The Qss charge is a residual charge which appears at or near the interface of the silicon and first silicon dioxide layer. This is undesirable since when the Qss charge surpasses a certain level, the threshold voltage required to activate a given component will also rise beyond a desirable level.

Refractory metals such as titanium, tungsten, molybdenum or combinations thereof do not form as good an ohmic contact with silicon or other semiconductor materials as does aluminum. A basic requirement of a metallization system is that it form an ohmic contact. One of the few metals which has the capability of forming excellent ohmic contact with semiconductor substrates is aluminum. However, aluminum does have the corrosion characteristics set forth above which makes it less desirable for nonhermetic environments.

In order to provide good ohmic contact when using refractory metal contact systems such as titanium-platinum-gold, molybdenum-gold or tungsten titanium alloy-gold, one must first provide a platinum silicide contact at the oxide openings where contact to the silicon is to be made. This is done by depositing platinum, sintering at about 650° C., and removing the unreacted platinum over the silicon dioxide layer. Platinum silicide is thereby formed at the contact openings. The refractory metals are then deposited on the platinum silicide to achieve good ohmic contact. This method requires the extra steps of forming the platinum silicide. In addition, the high temperature sinter can damage the semiconductor substrate.

It is, therefore, desirable: to formulate a metallization system for single level-bonding pad or beam lead devices or multiple level metallization systems on integrated circuits which can utilize the ohmic contacting characteristics of aluminum, but which can also incorporate non-corrosive metallization systems for use in nonhermetic semiconductor devices; to possess a metallization system which provides an aluminum ohmic contact with the semiconductor substrate and combines aluminum first level metallization with noncorrosive leads to a second metallization system; to possess a metallization system which will not increase in sheet resistivity upon being heated; to possess a first level metallization system which etches in a manner to provide controlled undercutting, thus producing tapered metal edges which promotes better insulating coverage, and; to possess a first level metallization system which provides an etch stop for feed through construction and also assures clean oxide removal upon feed through.

Furthermore, it is also desirable to possess a first level metallization system which will prevent hillock formations on the aluminum layers. Hillocks are caused by those crystallites in the aluminum layer which increase in grain size upon recrystallization when the aluminum layers are heated. The grain size increase causes compressive forces within the aluminum layer which in turn will cause surface discontinuities or bumps. These bumps are commonly termed hillocks. It is also desirable to possess a metallization system which can use to advantage the characteristics of gold as an upper level or top level metallization system and/or bonding pads and/or beam leads, while combining the gold metallization with the optimum characteristics which aluminum possesses in ohmic contact with a semiconductor material.

Heretofore, the metallurgical relationship of aluminum and molybdenum has prevented and inhibited further studies of a possible aluminum-molybdenum metallization system. Inspection of the aluminum-molybdenum phase diagram reveals that five intermetallic compounds ranging from $MoAl_2$ to $Mo_3Al$ are formed. Solid solubilities are neglegible below 700° C., however, in general when two metals can form intermetallic compounds, a bimetal sandwich in thin film form will be quite metallurgically unstable with large increases in sheet resistivity appearing upon heat aging. It, of course, was believed that an aluminum-molybdenum sandwich would be no exception to this general rule. Nevertheless, it has been discovered that a silicon device contacted with an aluminum layer on top of which a molybdenum film is formed exhibits unexpected properties. It has been found that an aluminum-molybdenum film exhibits remarkable and unexpected thermal stability. Films of aluminum and molybdenum, about 20 microns and about 15 microns respectively, exhibit no detectable increase in sheet resistivity after 1 hour at 500° C. This, of course, means that devices can be combined with a second level or gold lead system by utectic mounting at 450° C. without degradation. This experimental work has, of course, led to the applicability of the aluminum-molybdenum first level metallization to other areas than metal-oxide-silicon field effect transistor devices in which high sheet resistivity can be tolerated. For example, the applicability of aluminum-molybdenum first level metallization to nonhermetic integrated circuits was realized.

An aluminum-molybdenum first level metallization can also be utilized in large scale integration requiring multilevel metallization. In such applications, the characteristics of aluminum can be utilized along with the noncorrosive characteristics of other metallization systems. In addition, as has been pointed out, the molybdenum layer prevents hillock formation on the aluminum which is undesirable in such systems as an aluminum-silicon dioxide-aluminum or gold multilevel system. An aluminum-molybdenum system is also more resistant to electromigration problems, thus making it adaptable to emitter-coupled-logic (ECL) devices. The presence of the molybdenum layer as a current carrier plus its ability to reduce the surface diffusion coefficient of aluminum contributes to more reliable high current density operation. In addition, aluminum-molybdenum films can be etched into such finer geometries than can, for example, molybdenum-gold metallization systems.

This invention, therefore, provides a semiconductor device comprising a metallic multilayer ohmically contacting a semiconductor surface portion of the device, the metallic multilayer comprising a first layer of aluminum and a second layer of molybdenum. In another aspect, the present invention provides a semiconductor device comprising a silicon wafer, a first insulating coating on a surface of the wafer defining an opening therein the opening exposing a predetermined portion of the surface, a deposited layer of aluminum overlying a portion of the insulating coating and extending into the opening in ohmic contact with the predetermined portion of the surface, and a deposited layer of molybdenum overlying the layer of aluminum.

A method for fabricating integrated circuits from a wafer of semiconductor material is also provided within the scope of the present invention. This method comprises forming a layer of an insulating material on a surface of a wafer of semiconductor material, selectively removing the insulating layer according to a predetermined pattern and forming semiconductor components on the surface exposed through openings in the layer formed by the selective removal of the layer, ohmically connecting at least two of the components by depositing a layer of aluminum over the insulating layer, the exposed surface, and depositing a thin layer of molybdenum on the aluminum layer, selectively removing portions of the aluminum and molybdenum layers to form a predetermined lead pattern on the wafer.

A better understanding of the ensuing specification will be derived by reference to the accompanying drawings in which.

Figure 1:
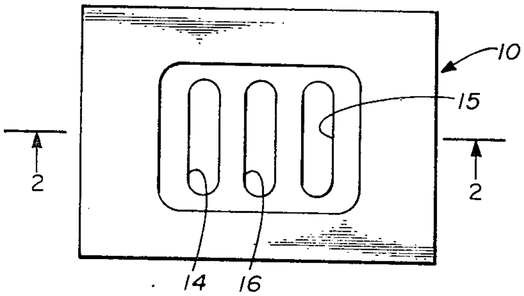
FIG. 1 is a plan view, illustrating a wafer of semiconductor material having a planar transistor formed therein, with openings formed in the insulating layer on the surface of the wafer for application of contacts.
Figure 2:
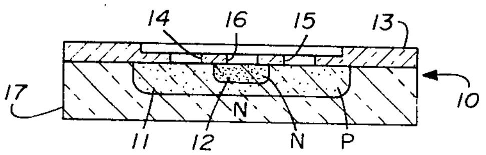
FIG. 2 is a sectional view of the semiconductor wafer shown in FIG. 1 taken along the line 2—2.

Referring now to FIGS. 1 and 2, a semiconductor wafer 10 has a transistor formed therein including base region 11 and emitter region 12. The remainder of the wafer provides the collector region 17. The transistor is formed by a common planar technique, using successive diffusions with silicon dioxide masking. The conventional fabrication techniques are not part of the invention and are so well known in the semiconductor industry that one skilled in the art will know how to carry out such methods. For full descriptions of these fabrication methods, refer to *Integrated Circuits — Design Principals and Fabrication*, Raymond M. Warner, Jr. and James N. Fordemwalt, McGraw Hill, (1965), *Silicon Semiconductor Technology*, McGraw Hill (1965), and *Physics and Technology of Semiconductor Devices*, A. S. Grover, Wylie and Sons (1967).

In the planar process an oxide layer 13 is formed on the top surface of the wafer. The layer over the collector region is thicker than over the base region resulting in a step configuration. For high frequencies, the geometry of the active part of the transistor is extremely small thus the elongated emitter region 12 is perhaps 0.1 to 0.2 mils wide and less than a mil long. The base region 11 is about 1 mil square. A pair of openings 14 and 15 are formed for the base contacts; an opening 16 is formed for the emitter contact, the latter being the same as used for the emitter diffusion. Due to the extremely small size of the actual base of the emitter contact area, the contacts must be extended out over the silicon oxide to facilitate bonding of leads for the base and emitter connections. The size of the semiconductor wafer is selected for convenience in handling, a typical size for the wafer 10 usually being about 3 mils on each side and about 4 mils thick. It is, of course, understood that the drawings are exaggerated for clarity of illustration. Typically, during all of the process steps described below, the wafer 10 is merely a small undivided part of a large slice of silicon, perhaps 1 inch in diameter and 8 mils thick. This slice is broken into individual wafers after the contacts are applied.

Figure 3:
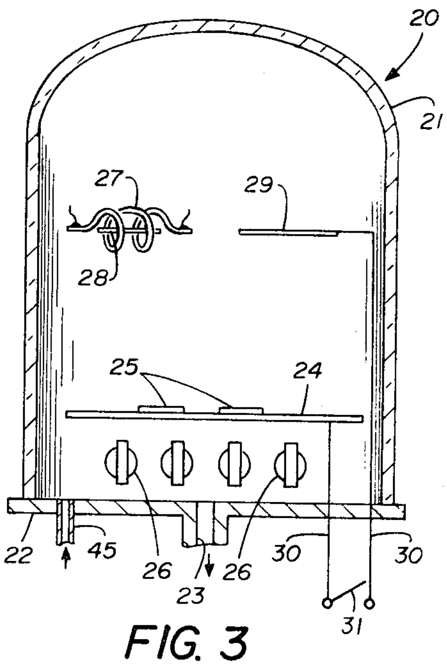
FIG. 3 is a schematic view partly in section illustrating a deposition apparatus suitable for applying the contacts to a wafer as shown in FIG. 4.
Figure 4:
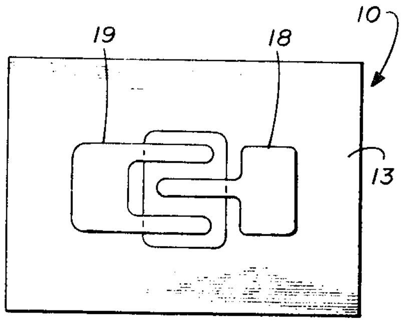
FIG. 4 is a plan view illustrating the wafer shown in FIG. 1 after the contacts and bonding pads have been applied.

To deposit a layer of aluminum metal from which the emitter contact 18 and base contact 19 are formed, as shown in FIG. 4, the wafer 10, as part of a large slice of silicon, along with a number of other slices, is placed in an evaporation chamber 20 illustrated in FIG. 3. The evaporation chamber 20 comprises a bell jar 21 mounted on a base plate 22. An opening 23 in the base plate is connected to a vacuum pump for evacuating the chamber. A stainless steel sheet 24 is mounted in a thermally isolated manner above the base plate 22 by means not shown. The sheet 24 serves as the work holder for a plurality of silicon slices 25, each of which includes at its upper face, in an undivided form dozens or hundreds of the transistors or silicon wafers 10 as shown in FIGS. 1 and 2. Below the sheet 24 a bank of quartz infrared tubes 26 are positioned. These tubes 26 function to heat the sheet and the slices to any desired temperature, usually in the range of from 200° to 400° C. These quartz tubes are utilized to maintain the slice temperature at the selected point with a fair degree of precision. A suitable temperature control, including a thermocouple and a feedback arrangement (not shown) is provided for this purpose. About 4 inches above the sheet 24 a tungsten coil 27 is positioned for evaporating a charge 28 of aluminum.

To effect deposition, the evaporation chamber 20 is evacuated to about $6 \times 10^{-6}$ millimeters of mercury. Prior to being inserted into the evaporation chamber a careful cleaning procedure for the slices is followed prior to deposition. For example, the silicon slices, with transistors or the like formed therein and contact areas defined in the insulating coating, silicon dioxide, are placed in concentrated sulfuric acid at about 150° to 200° C. for about 10 minutes, removed, and rinsed in deionized water. The slices are then placed in boiling nitric acid for about 5 minutes and again rinsed in deionized water. Thereafter the slices can be dipped in dilute hydrofluoric acid (or a 10 percent solution of ammonium bifluoride) for about 6 seconds, rinsed in cold deionized water for about 20 minutes, rinsed in acetone, and dried. The slices are then immediately moved into the evaporation chamber for evacuation and evaporation. The function of the hot sulfuric acid is to remove all organic materials from the exposed surface of the silicon and silicon dioxide. These organic materials can be, among other things, residue from the photoresist polymer used in forming the transistor. The nitric acid removes sulfate residue from the previous step. The hydrofluoric acid insures that all oxide is removed from the silicon surface in the contact areas. The hydrofluoric acid dip likewise removes some of the oxide coating 13, but since the coating over most of the device is many times thicker than the residue over the base and emitter contact areas, the coating remains essentially intact.

Figure 6:
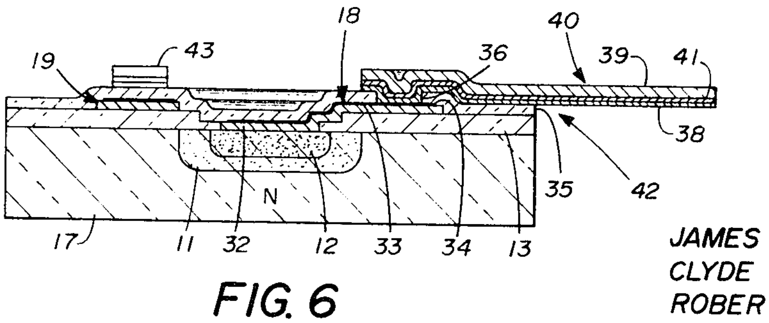
FIG. 6 is a cross-sectional view of the wafer of FIG. 5 taken along section line 6—6.

The aluminum is deposited to a thickness of perhaps 8,000 to 15,000 angstroms upon the entire top face of each slice. The deposition is effected by applying power to the infrared tubes 26 until their temperature reaches about 250° to 300° C. The tungsten filament 27 is then energized to vaporize the aluminum charge 28 and deposit an aluminum film 32 as seen in FIG. 6 on the silicon slices 25. After the desired thickness of aluminum has been achieved, the tungsten filament 27 is de-energized and the infrared tubes 26 are de-energized. RF-energy, at a frequency of about 15 megacycles, is then applied between molybdenum sputter plate 29 and support plate 24 by energizing source 30. It is to be remembered that the positioning of the elements is only schematic, for example, the plate 29 and slices 25 are usually equidistant from each other. Argon gas is then admitted through tube 45 to a pressure of about 5 to 15 microns of mercury. Molybdenum atoms are driven from the plate 29 and are deposited on the slices 25. The molybdenum film 33 is much thinner than the aluminum film, generally being deposited to a thickness of about 800 to 2,000 angstroms. When the proper and desired thickness of molybdenum has been deposited on the aluminum film, the RF source 31 is de-energized and the substrate and films are allowed to cool. Other methods for depositing the aluminum and molybdenum include, respectively, filament evaporation and sublimation, filament evaporation and sputtering (DC diode, DC triode, or RF, as shown), filament evaporation and electron gun evaporation, and electron gun evaporation for both. The latter is a commercially available technique.

After removing the slices from the evaporation chamber, excess portions of the aluminum-molybdenum coating 32, 33 are removed by subjecting the silicon slices to a selective photoresist masking and etching (hereafter photoetch) treatment. A thin coating a a photoresist polymer, for example, Eastman Kodak's KMER, is applied to the entire top surface of the wafer or slice. This conventional photoresist is exposed to ultraviolet light through a mask which allows light to reach the areas where the aluminum-molybdenum film is to remain. The unexposed photoresist is then removed by developing in a photo developing solution. At this point, a layer of photoresist overlies the portion of the aluminum-molybdenum coating which is to form the base contact, the emitter contact and expended lead area as seen in FIG. 4.

The slice is then subjected to an etching solution to remove the unwanted portions of the aluminum and molybdenum layers to leave the base and emitter contacts 19 and 18 respectively. An exemplary etch solution for removing unwanted aluminum-molybdenum metal is 70 milliliters phosphoric acid, 15 milliliters acetic acid, 3 milliliters nitric acid and 5 milliliters of deionized water. The etching time will, of course, vary with the thicknesses of the two layers. For the thicknesses given in the above example, etching time will be form about 45 to 60 seconds at an etch temperature of about 50° to 70° C. It will be noted that molybdenum etches slightly faster than aluminum, thus leaving a stepped metallic aluminum-molybdenum layer. This stepped structure is, in fact, a desirable phenomenon since it allows a more effective insulating layer to be applied on top of the first layer or level of metallization. A stepped portion 34 of the molybdenum layer is shown in FIG. 6 at the edges of the first level metallization.

After the unwanted portions of the aluminum-molybdenum layer have been removed, the photoresist mask which has remained intact through the etching step is now removed by rinsing in a solvent such as methylene chloride. The emitter and base contact areas, 18 and 19, as they would appear after removal of the photoresist mask are shown in FIG. 4.

Figure 5:
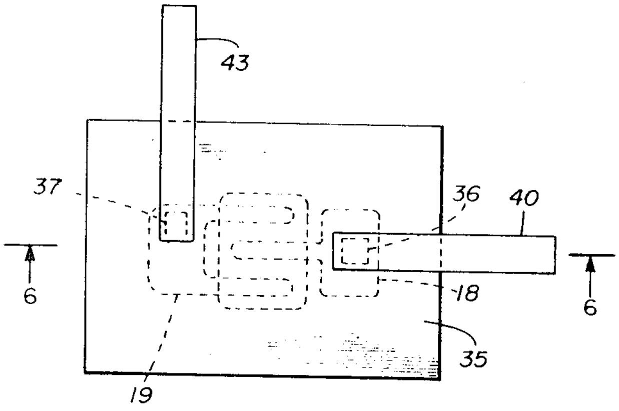
FIG. 5 is a plan view of the wafer shown in FIG. 4 after an insulating layer and beam leads have been applied thereto.

Referring now to FIGS. 5 and 6, after the photoresist mask is removed, a second layer 35 of silicon dioxide is applied to the top of the wafer, initially covering both the contacts 18 and 19 and the first layer of oxide 13. Thereafter a conventional photoetching step utilizing a hydrofluoric acid etching solution is again used to form a window or opening 36 to expose the emitter contact 18. Similarly, at the same time a second window or opening 37 is formed in the oxide layer to expose the base contact 19.

After the openings 36 and 37 have been formed in the second oxide layer 35, a noncorrosive or corrosion resistant metallization system can be applied. Various types of noncorrosive metallization systems are known. These include a tungsten layer modified with titanium, tantalum, chromium, zirconium, hafnium or silicon. Of these a titanium modified tungsten mixture is preferred. The deposition procedure disclosed therein employs conventional RF-sputtering techniques.

Normally, a first layer 38 (refer to FIG. 6) of a titanium modified tungsten alloy 38 is applied utilizing a conventional RF-sputtering technique. A supporting structure (not shown) is provided so that the tungsten-titanium layer metallization which is deposited onto the silicon dioxide layer 35 and into the opening 36 can extend out beyond the edge 42 of the silicon wafer 17 and the silicon dioxide layer 35. The tungsten-titanium layer is usually deposited to a thickness of from 1,000 to 4,000 Angstroms. Thereafter a layer 41 of gold usually from 3,000 to 10,000 Angstroms thick is deposited by evaporation techniques very similar to those described above for aluminum on the layer of tungsten-titanium alloy. Photoetching is then utilized again to remove unwanted portions of the gold layer 41. A photomask is then placed over the tungsten-titanium layer, covering all portions of that layer except the areas on which the overlying deposited gold remains. Thereafter a thick layer 39 of gold, usually about 1 mil, is plated onto the deposited layer 41 by conventional plating techniques. These techniques are well known in the art. For example, see "-Beam-Lead Technology," M. P. Lepselter, *The Bell System Technical Journal*, p. 233 et seq., February, 1966.

The layers 38, 39 and 41 combine to form a beam lead structure for connection to the outside world through an encapsulating and lead structure (not shown). As shown in FIG. 5, two beam lead structures have been formed. A first structure 40 is conductively connected to emitter contact 18 and a second beam lead structure 43 is conductively connected to base contact 19. Both of the beam lead structures are formed at the same time; however, for purposes of illustration, the fabrication of the beam leads comprising layers 38, 39 and 41 has only been described.

Other metallization systems can be utilized for the formation of beam leads. These systems include a first deposited layer of titanium corresponding to layer 38, a second deposited layer of platinum corresponding to layer 41 and a third deposited layer of gold corresponding again to plated layer 39. Other metallization systems for the beam leads are apparent to those of ordinary skill in the art. The tungsten-titanium-gold system has been described in detail since it is a preferred beam lead construction.

After the beam structure 39 is plated onto the underlying deposited layer of gold, the semiconductor wafer and associated lead structure and insulating layers are mounted in a suitable capsule. These encapsulation techniques are also known to those skilled in the art, and, therefore, will not be elaborated. Of course, the encapsulation techniques to which the present invention is especially adapted are those in which a nonhermetic structure is desired.

Figure 7:
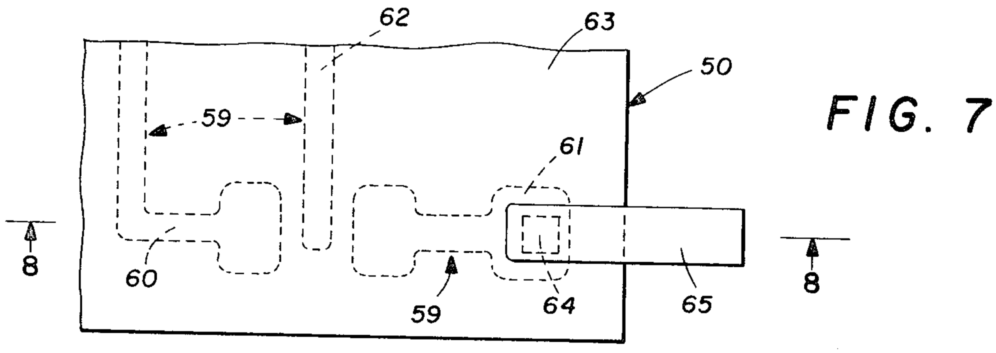
FIG. 7 is a partial plan view of a metal-oxide-semiconductor field effect transistor employing the first level metallization system of the present invention to which beam leads have been attached.
Figure 8:
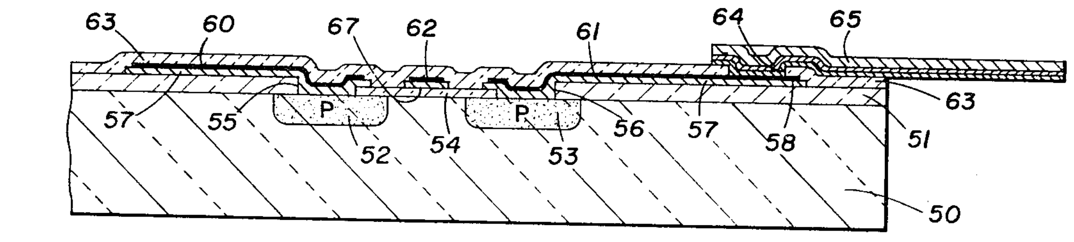
FIG. 8 is a cross-sectional view of the transistor of FIG. 7 taken along section line 8—8.

Referring now concurrently to FIGS. 7 and 8, an integrated circuit, the portion of which illustrated contains a metal-oxide-semiconductor field effect transistor, is shown in which the metallization system of the present invention has been employed to form the first level of metallization. In this embodiment a silicon wafer 50 of N-type conductivity has had diffused therein to P-type regions or elements 52 and 53. An insulating layer 51 of silicon dioxide has been formed on the upper surface of the wafer 50. The openings that will provide the source and drain of a field effect transistor have been photoetched into the oxide layer 51. The P-type diffusion regions form the source and drain elements, 52 and 53, respectively. Thereafter a thin layer 54 of silicon dioxide is formed over the gate area of the device by first removing the original oxide layer present over the gate area and then redepositing a thin layer of silicon dioxide over the entire surface of the wafer. Thereafter, openings 55 and 56 are photoetched into the new silicon dioxide layer. A summary of this technique is described in "Large-Scale Integration in Electronics," F. G. Heath, *Scientific American*, January, 1970, at pages 28 and 29.

A layer 57 of aluminum is then deposited over the surface of the oxide layer 51 and is deposited in ohmic contact with the source and drain elements 52 and 53 of the semiconductor device. Thereafter a thin layer 58 of molybdenum is deposited on the layer 57 of aluminum. By photoetching as described above, the unwanted portions of the aluminum-molybdenum layers are removed to form the lead system 59 shown as dotted lines in FIG. 7. Thus a lead 60 has been formed in ohmic contact with source region 52 and a lead 61 has been formed in ohmic contact with drain region 53. In addition, a lead 62 has been formed in contact with the gate region 67 of the field effect transistor.

Thereafter, a second oxide layer 63 is deposited on the previous oxide layer 51 and on top of the first level metallization system comprising the leads 59. Again by photoetching techniques, an opening 64 is formed in the oxide layer 63 to expose a portion of the lead 61. A beam lead 65, preferably of a noncorrosive metallization system, is then formed in ohmic contact with the lead 61 to extend over the edge of the integrated circuit wafer 50. The beam lead is formed utilizing the same techniques described above in conjunction with the planar device illustrated in FIGS. 5 and 6. Thus, a desirable first level metallization system has been provided for an integrated circuit wafer 50. An insulating layer 63 covers this first level lead system 59. The first level lead system is thereafter given the capability of contact with the outside world, that is the connections through which the device is utilized, via the beam lead 65. After the beam lead has been formed, the integrated circuit wafer, insulating layers and a portion of the beam lead are encapsulated by conventional techniques, including a plastic encapsulating system as described above.

Figure 9:
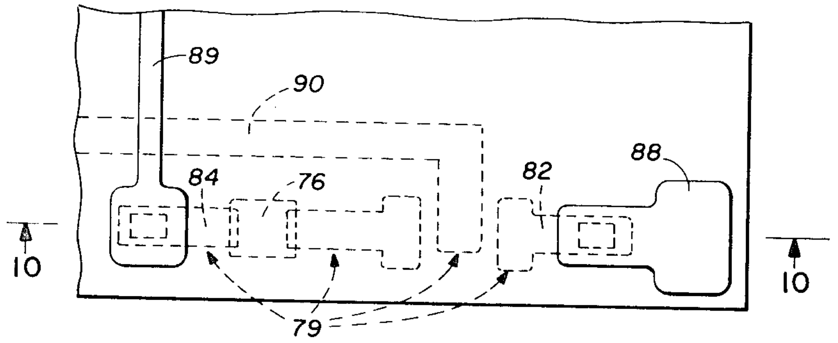
FIG. 9 is a partial plan view of an integrated circuit semiconductor of the type requiring multilevel metallization in which the first level metallization system of the present invention has been employed and to which bonding pads have been applied.
Figure 10:
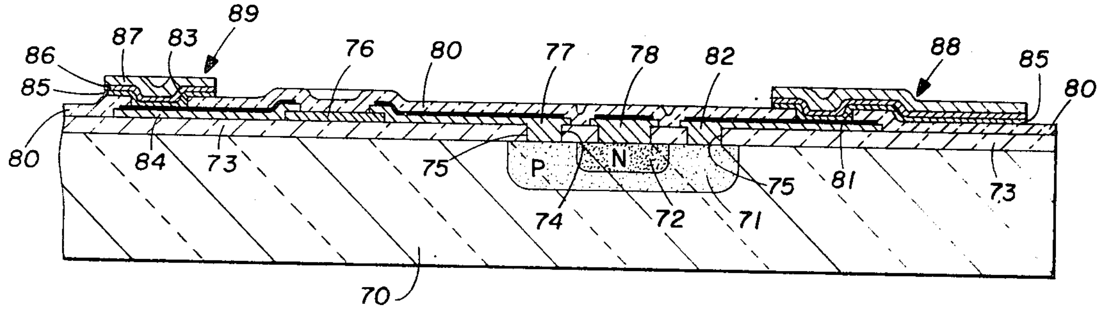
FIG. 10 is a cross-sectional view of the integrated circuit semiconductor of FIG. 9 taken along section line 10—10.

FIGS. 9 and 10 illustrate an example of the present invention utilized with a system requiring two levels of metallization. Such systems are well known in the art. Referring jointly to the latter two figures, an integrated circuit wafer 70 of N-type is provided with diffused regions 71 and 72 of P-type and N-type, respectively. A layer 73 of silicon dioxide 73 has been deposited on the upper surface of the wafer 70. The diffused regions 71 and 72 have been formed through openings or windows 74 and 75. In this circuit arrangement also a thin film resistor 76, for example of nichrome, has also been deposited on the silicon dioxide layer 73. An aluminum-molybdenum first level metallization system comprising a first layer 77 of aluminum and a second layer 78 of molybdenum has been deposited on the oxide layer 73. The aluminum-molybdenum layer has then been selectively photoetched according to a predetermined pattern to form the first level lead system shown as 79 in FIG. 9. This lead system makes ohmic contact with the P-type region 71, the N-type region 72 and with the thin film resistor 76.

Another insulating layer 80 of silicon dioxide is then deposited over the entire surface of the silicon wafer, thereby covering the first oxide layer 73 and the lead system 79. By photoetching, new windows or openings are then formed in the second oxide layer 80. The detailed technology of forming these oxide layers is disclosed in copending application (TI–3068) to S. Wood, C. Fuller and J. Cunningham, Ser. No. 699,169, filed Jan. 19, 1968. A first opening 81 exposes lead 82 of the first level metallization system. A second opening 83 exposes lead 84 of the first level metallization system. Thereafter a second level metallization system is applied. This second level system preferably is one of the noncorrosive metallization systems described above. As shown, a first layer 85 of a tungsten-titanium alloy has been deposited followed by a second layer 86 of deposited gold which has been selectively patterned by photoetching techniques. The second level metallization system includes contact pad 88 and the lead 89. As will be noted, it has been necessary for lead 89 to cross over lead 90 of the first level metallization. These leads are separated by oxide layer 80, preventing electrical contact therebetween.

After the second level lead system has been formed, the integrated circuit wafer can be encapsulated in plastic. If desired, another level or layer of silicon dioxide can be over laid onto the second level metallization system and the oxide layer 80, thereafter etching that layer to expose the contact pad 88. The contact pad 88 can then be connected to the outside world via conventional ball bonding with gold wires or other conventional lead attachment techniques. It should be noted here that careful selection must be made of second level and lead attachment metallization systems to assure compatibility of the interconnecting systems. Beam leads can also be attached to the contact pad 88, through a third layer of oxide. Beam leads have not been shown here, however, to better illustrate the diversity of the present invention.

To reiterate, the aluminum-molybdenum metallization system of this invention has several distinct advantages over other first level metallization systems brought about in part by its unexpected low sheet resistivity upon heat aging. Other comparable films, for example, an aluminum-tungsten or an aluminum-titanium film may behave metallurgically similarly; however, these films are very difficult to etch compared to the aluminum-molybdenum film. In addition, with respect to multilevel metallization systems, the layer of molybdenum of this invention provides an etch stop for feed through construction, preventing etching of the underlying aluminum, i.e., silicon dioxide etchants do not react with molybdemum whereas a reaction occurs with aluminum. It also assures clean silicon dioxide removal in the feed through since molybdenum and silicon dioxide do not react chemically as do aluminum and silicon dioxide. When a gold system is used for second level metallization, the aluminum-molybdenum system of this invention prevents interaction between the second level gold and aluminum on the first level. This is true whether using a titanium-platinum-gold system or a tungsten-titanium alloy-gold system. By using an aluminum-molybdenum first level, electrolytic interaction is avoided since the layer of molybdenum is continuous across the bottom of each feed through hole, thus eliminating any contact by the second level metallization system with the aluminum in the first level metallization. For bipolar semiconductor applications, it should be noted that an aluminum-molybdenum system is more resistant to reliability problems related to electromigration because of the presence of the refractory molybdenum layer. High current density effects are almost nonexistent in molybdenum because it has a very large value of activation energy for self diffusion.

As is apparent, the present invention provides a significant advance in the art of fabricating semiconductor devices and especially in the fabrication of integrated circuits. Unexpectedly, an aluminum-molybdenum first level metallization system provides excellent ohmic contact with semiconductor substrates while providing good ohmic contact with second level metallization systems. Whether beam leads or circuit leads are employed, this invention prevents undesirable degradation and side reactions caused by interaction of the two metallization systems themselves or caused by the application or deposition of the second level metallization. Thus the present invention allows the conventional use of aluminum while combining it as a first level metallization system with recently discovered noncorrosive second level metallization systems. Variations upon the present invention will be apparent to those of ordinary skill in the art. Although the foregoing description relates to preferred embodiments of the present invention, it is intended that the invention be limited only be the definition of the following claims.

What is claimed is:

1. A semiconductor device comprising:

a substrate containing semiconductor components and having an insulating layer over one face thereof, a plurality of levels of ohmically interconnecting metallizations substantially separated by insulating layers, the uppermost level of said metallizations comprising leads for connecting said device to other circuits, a level of metallization immediately below said uppermost level comprising a first layer of aluminum and a second relatively thin layer of molybdenum in ohmic contact with said uppermost level, the bottom layer of said metallizations ohmically contacting selected ones of said components, said uppermost level comprising a noncorrosive metallization consisting of a pseudo alloy of titanium and tungsten and an overlying layer of gold.

2. The device of claim 1 wherein the thickness of said aluminum layer ranges from 8,000 to 15,000 Angstroms and said molybdenum layer ranges from 800 to 2,000 Angstroms.

3. A noncorrosive metallization system for a semiconductor device comprising:

a. a semiconductor substrate having first and second zones of opposite conductivity type forming a P-N junction therebetween, terminating at one surface of said substrate beneath an insulating layer on said one surface, said insulating layer defining an opening therein exposing a portion of said first zone, b. a first metallization on and adherent to said insulating layer ohmically connecting to the exposed portion of said first zone, said metallization comprising a first layer of aluminum and a second layer of molybdenum, c. a second insulating layer on said first insulating layer and said first metallization, said second insulating layer defining an opening therein exposing a portion of said first metallization, d. a second metallization on and adherent to said second insulating layer and ohmically connecting to the exposed portion of said first metallization, said second metallization including a first layer of a pseudo alloy of tungsten and titanium and a layer of gold, and e. a conductive reenforcing noncorrosive metallic beam ohmically connected to said second metallization to form a lead from said device.

4. A semiconductor device comprising:

a. a silicon wafer, b. a first insulating coating on a surface of said wafer defining a first opening therein, said opening exposing a predetermined portion of said surface, c. a deposited layer of aluminum overlying a portion of said insulating coating and extending into said opening in ohmic contact with said predetermined portion of said surface, said aluminum layer extending in a predetermined pattern over said insulating coating, terminating at a location spaced from said first opening, d. a relatively thin deposited layer of molybdenum overlying said layer of aluminum, e. a second insulating coating overlying said first insulating coating and said layers of aluminum and molybdenum, said second insulating coating defining an opening at said spaced location to expose a predetermined portion of said layer of molybdenum, and f. a noncorrosive metallization overlying, in a predetermined pattern, said second insulating layer and said exposed portion of said layer of molybdenum and extending beyond the edge of said wafer to form a beam lead from said semiconductor device wherein said noncorrosive metallization includes a first metallic composition comprising a pseudo alloy of tungsten and titanium and a second metallic composition comprising gold.

5. The device of claim 4 wherein said insulating coatings comprise silicon dioxide.

* * * * *